(12) United States Patent
Park et al.

(10) Patent No.: US 12,489,038 B2
(45) Date of Patent: Dec. 2, 2025

(54) SEMICONDUCTOR DEVICE PACKAGE

(71) Applicant: Samsung Electronics Co., Ltd., Suwon-si (KR)

(72) Inventors: Younghwan Park, Seongnam-si (KR); Jongseob Kim, Seoul (KR); Jaejoon Oh, Seongnam-si (KR); Soogine Chong, Seoul (KR); Sunkyu Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 15 days.

(21) Appl. No.: 18/495,697

(22) Filed: Oct. 26, 2023

(65) Prior Publication Data

US 2024/0055330 A1 Feb. 15, 2024

Related U.S. Application Data

(62) Division of application No. 17/192,439, filed on Mar. 4, 2021, now abandoned.

(30) Foreign Application Priority Data

Nov. 10, 2020 (KR) .................. 10-2020-0149583

(51) Int. Cl.
*H01L 23/495* (2006.01)
*H01L 21/48* (2006.01)

(52) U.S. Cl.
CPC .... *H01L 23/49562* (2013.01); *H01L 21/4825* (2013.01); *H01L 23/4951* (2013.01);
(Continued)

(58) Field of Classification Search
CPC ........... H01L 23/49562; H01L 23/4951; H01L 23/49548–49555; H01L 23/49568;
(Continued)

(56) References Cited

U.S. PATENT DOCUMENTS 8,058,107 B2  11/2011 Cruz et al.
2002/0121684 A1* 9/2002 Kobayakawa .......... H01L 24/97
257/E23.047
(Continued)

FOREIGN PATENT DOCUMENTS

CN  110310923 A  10/2019
JP  2003-124240 A  4/2003
(Continued)

OTHER PUBLICATIONS

Definition of "integral". Merriam-Webster online dictionary. (Year: 2025).*
(Continued)

*Primary Examiner* — Yu Chen
(74) *Attorney, Agent, or Firm* — Harness, Dickey & Pierce, P.L.C.

(57) ABSTRACT

A semiconductor device package includes a lead frame, a semiconductor device including a first face connected to the lead frame, a second face that faces the first face, a gate pad, a drain pad, and a source pad, the gate pad exposed on the second face of the semiconductor, the drain pad exposed on the second face of the second face, and the source pad exposed on the second face, a gate clip connected to the gate pad, a drain clip connected to the drain pad, a source clip connected to the source pad, the source clip connected to the lead frame, and a molding that seals the lead frame, the semiconductor device, the source clip, the drain clip, and the gate clip.

13 Claims, 12 Drawing Sheets

(52) U.S. Cl.
CPC .. *H01L 23/49524* (2013.01); *H01L 23/49551* (2013.01); *H01L 23/49568* (2013.01)

(58) Field of Classification Search
CPC ... H01L 2224/40105; H01L 2224/3702; H01L 2224/37012; H01L 2224/06181; H01L 2224/06519; H01L 2224/09181; H01L 2224/09519; H10D 30/65–659; H10D 30/663

See application file for complete search history.

(56) References Cited

U.S. PATENT DOCUMENTS

| | | |
|---|---|---|
| 2012/0313229 A1 | 12/2012 | Lee et al. |
| 2013/0105974 A1 | 5/2013 | Tsui |
| 2015/0001695 A1 | 1/2015 | Hebert |
| 2016/0247748 A1 | 8/2016 | Kinzer |
| 2016/0268185 A1 | 9/2016 | Mcknight-Macneil et al. |
| 2016/0268190 A1 | 9/2016 | Mcknight-Macneil et al. |
| 2016/0307826 A1 | 10/2016 | Mcknight-Macneil et al. |
| 2016/0307862 A1 | 10/2016 | Lin et al. |
| 2020/0411421 A1 | 12/2020 | Teysseyre et al. |
| 2021/0005516 A1 | 1/2021 | Li |
| 2022/0148948 A1 | 5/2022 | Park et al. |

FOREIGN PATENT DOCUMENTS

| | | |
|---|---|---|
| JP | 2008-042007 A | 2/2008 |
| JP | 2009-278103 A | 11/2009 |
| KR | 10-2008-0070068 A | 7/2008 |
| KR | 10-0891649 B1 | 4/2009 |
| KR | 10-2009-0098072 A | 9/2009 |
| KR | 10-1652423 B1 | 8/2016 |

OTHER PUBLICATIONS

Johan T. Strydom, "Impact of Parasitics on GaN-Based Power Conversion" Springer International Publishing AG, pp. 123-152 (2018).

Jae-Kyung Mun, et al. "Global R&D Status and Future Development Direction of GAN Power Semiconductor" ICT Future Core Materials Parts Technology Special. vol. 31, No. 6 (Serial No. 162) pp. 1-14 (2016).

* cited by examiner

SEMICONDUCTOR DEVICE PACKAGE

CROSS-REFERENCE TO RELATED APPLICATION

This application is a divisional of U.S. application Ser. No. 17/192,439, filed Mar. 4, 2021, which claims priority under 35 U.S.C. § 119 to Korean Patent Application No. 10-2020-0149583, filed on Nov. 10, 2020, in the Korean Intellectual Property Office, the entire contents of each of which are incorporated herein by reference.

BACKGROUND

Some example embodiments relate to semiconductor device packages and/or methods of manufacturing the same.

Semiconductor devices, such as discrete semiconductor devices, are formed on/fabricated on a substrate, such as a wafer, through a series of semiconductor processes. A plurality of semiconductor devices may be arranged on one wafer. A semiconductor device package is manufactured by a process of connecting a plurality of terminals to electrodes of a semiconductor device and molding the semiconductor device and the plurality of terminals with an electrically insulating resin.

The electrodes of the semiconductor device and the plurality of terminals may be connected to each other by metal wires. In a case of the semiconductor device package having such a structure, the semiconductor device package may be weak in terms of parasitic inductance and/or heat dissipation. Alternatively or additionally, various power conversion systems may employ a device; for example, a semiconductor power device may control the flow of current through ON/OFF switching. The semiconductor power device uses a large amount of current to flow, so that the number of metal wires increases, thereby using a lot of process cost and/or time.

SUMMARY

Provided are semiconductor device packages having improved heat dissipation performance.

Provided are semiconductor device packages capable of reducing parasitic inductance.

Provided are semiconductor device packages capable of reducing process cost and/or time.

Additional aspects will be set forth in part in the description which follows and, in part, will be apparent from the description, and/or may be learned by practice of the some example embodiments of the disclosure.

According to some example embodiments, a semiconductor device package includes a lead frame, a semiconductor device including a first face connected to the lead frame, a second face that faces the first face, a gate pad, a drain pad, and a source pad, the gate pad exposed on the second face of the semiconductor, the drain pad exposed on the second face of the second face, and the source pad exposed on the second face, a gate clip connected to the gate pad, a drain clip connected to the drain pad, a source clip connected to the source pad, the source clip connected to the lead frame, and a molding that seals the lead frame, the semiconductor device, the source clip, the drain clip, and the gate clip.

The source clip may include a bonding portion connected to the source pad, and the bonding portion covers 30% or more of an area of the first face of the semiconductor device.

The source clip may be integral with the lead frame.

The source clip may include an extension portion bent from the lead frame, the extension portion bent toward the second face, and a bonding portion extending above the source pad, the bonding portion extending from the extension portion, the bonding portion connected to the source pad.

The bonding portion may have a recession portion recessed toward the extension portion.

The drain pad may include an extension pad extending into the recession portion, and the drain clip comprises an extension clip connected to the extension pad.

The semiconductor device package may include a molding that seals the lead frame, the semiconductor device, the source clip, the drain clip, and the gate clip.

An outer surface of a portion of the lead frame that is connected to the first face may be exposed to the outside of the molding.

The gate clip may include a first bonding portion connected to the gate pad and a first extension portion extending parallel to the lead frame, the extension portion extending from the first bonding portion, the drain clip comprises a second bonding portion connected to the drain pad and a second extension portion extending parallel to the lead frame, the extension portion extending from the second bonding portion, an outer surface of a portion of the lead frame connected to the first face is exposed to the outside of the molding, faces of the first extension portion that face the first face of the semiconductor device are exposed to the outside of the molding, and faces of the second extension portion that face the first face of the semiconductor device are exposed to the outside of the molding.

The first extension portion and the second extension portion may be entirely exposed to the outside of the molding.

Faces of the bonding portion that face the second face of the semiconductor device are exposed to the outside of the molding, faces of the first bonding portion that face the second face of the semiconductor device are exposed to the outside of the molding, and faces of the second bonding portion that face the second face of the semiconductor device may be exposed to the outside of the molding.

The semiconductor device package may include a heat dissipation body contacting the faces of the bonding portion that face the second face of the semiconductor device, contacting faces of the first bonding portion that face the second face of the semiconductor device, and contacting faces of the second bonding portion that face the second face of the semiconductor device.

The bonding portion may be buried in the molding, and a heat dissipation fin exposed to the outside of the molding may be in the bonding portion.

The gate clip may include a first bonding portion that is connected to the gate pad, the drain clip comprises a second bonding face the second portion that is connected to the drain pad, and an outer surface of a portion of the lead frame connected to the first face is exposed to the outside of the molding, faces of the bonding portion that face of the semiconductor device are exposed to the outside of the molding, faces of the first bonding portion that face the second face of the semiconductor device are exposed to the outside of the molding, and faces of the second bonding portion that face the second face of the semiconductor device are exposed to the outside of the molding.

The source clip may include a bonding portion connected to the source pad, and an extension portion extending from the bonding portion to an upper surface of the lead frame, the extension portion connected to the upper surface of the lead frame.

The semiconductor device package may include the molding that seals the lead frame, the semiconductor device, the source clip, the drain clip, and the gate clip.

The outer surface of the portion of the lead frame that is connected to the first face of the semiconductor device may be exposed to the outside of the molding.

The gate clip may include a first bonding portion connected to the gate pad and a first extension portion extending parallel to the lead frame, the first extension portion extending from the first bonding portion, the drain clip comprises a second bonding portion connected to the drain pad and a second extension portion extending parallel to the lead frame, the second extension portion extending from the second bonding portion, an outer surface of a portion of the lead frame connected to the first face of the semiconductor device is exposed to the outside of the molding, faces of the first extension portion that face the first face of the semiconductor device are exposed to the outside of the molding, and faces of the second extension portion that face the first face of the semiconductor device are exposed to the outside of the molding.

The first extension portion and the second extension portion may be entirely exposed to the outside of the molding.

The faces of the bonding portion, the first bonding portion, and the second bonding portion that face the second face of the semiconductor device may be exposed to the outside of the molding.

The semiconductor device package may include a heat dissipation body contacting the faces of the bonding portion that face the second face of the semiconductor device, the faces of first bonding portion that face the second face of the semiconductor device, and the faces of the second bonding portion that face the second face of the semiconductor device.

The gate clip may include a first bonding portion connected to the gate pad, the drain clip comprises a second bonding portion connected to the drain pad, an outer surface of a portion of the lead frame connected to the first face of the semiconductor device is exposed to the outside of the molding, faces of the bonding portion that face the second face of the semiconductor device is exposed to the outside of the molding, faces of the first bonding portion that face the second face of the semiconductor device are exposed to the outside of the molding, and faces of the second bonding portion that face the second face of the semiconductor device are exposed to the outside of the molding.

According to some example embodiments, a semiconductor device package includes a lead frame, a semiconductor device comprising a first face connected to the lead frame, a second face that faces the first face, and a plurality of electrode pads exposed on the second face, a plurality of clips connected to the plurality of electrode pads, and a molding that seals the lead frame, the semiconductor device, and the plurality of clips. An outer surface of a portion of the lead frame connected to the first face of the semiconductor device is exposed to the outside of the molding, and at least one of the plurality of clips connects to the lead frame.

The semiconductor device may include a horizontal channel-type semiconductor power device.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION OF SOME EXAMPLE EMBODIMENTS

Figure 1:
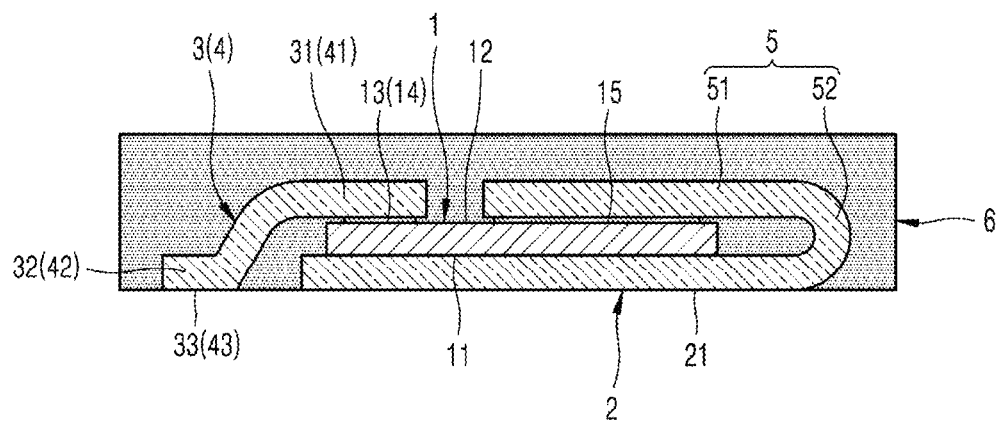
FIG. 1 is a schematic cross-sectional view of some example embodiments of a semiconductor device package.

Reference will now be made in detail to some embodiments, examples of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. Furthermore as illustrated in the drawings, some elements may be identified by more than one numerical identifier, with one identifier in parentheses. Unless clear from context, it is to be understood that the element so labelled may be described below with reference to either label. For example, the gate clip (drain clip) is labeled as 3(4), and may refer to either the gate clip 3, or alternatively, the drain clip 4.

Hereinafter, some example embodiments of a semiconductor device package and/or a method of manufacturing the same will be described in detail with reference to the accompanying drawings. In the following drawings, the same reference numerals refer to the same components, and the size or thickness of each component in the drawings may be exaggerated for clarity and convenience of description. Meanwhile, example embodiments described below are merely exemplary, and various modifications may be made from example embodiments. Furthermore unless otherwise stated example embodiments described herein are not to be construed as mutually exclusive. For example some example embodiments may include features described with respect to one figure and features described with reference to another figure.

Hereinafter, what is described as "above" or "on" may include what is directly on with contact, as well as what is on without contact. Singular expressions include plural expressions unless the context clearly indicates otherwise. When a part "includes" a certain component, it means that other components may be further included rather than excluding other components unless specifically stated to the contrary.

The use of the term "said" and similar indicating terms may correspond to both the singular and the plural. For steps constituting a method, if there is no explicit order or contradictory statement, the steps may be performed in an appropriate order. It is not necessarily limited to the order of description of the steps.

Terms such as first and second may be used to describe various components, but the components should not be limited by the terms. The terms are used only for the purpose of distinguishing one component from another component. A high electron mobility transistor and the corresponding fabrication/manufacturing method may be implemented in a number of different forms and are not limited to example embodiments described herein.

Figure 2:
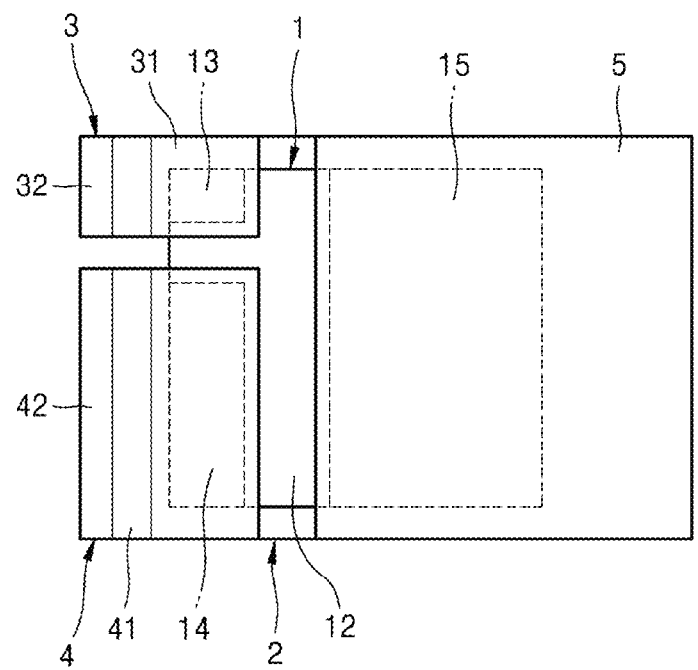
FIG. 2 is a schematic plan view of some example embodiments of the semiconductor device package shown in FIG. 1.

FIG. 1 is a schematic cross-sectional view of some example embodiments of a semiconductor device package. FIG. 2 is a schematic plan view of example embodiments of the semiconductor device package shown in FIG. 1. Referring to FIGS. 1 and 2, a semiconductor device 1, a lead frame 2, a gate clip 3, a drain clip 4, and a source clip 5 are shown. The semiconductor device package may include a molding 6 for sealing or that seals the lead frame 2, the semiconductor device 1, the source clip 5, the drain clip 4, and the gate clip 3. The molding 6 may include an electrically insulating resin, for example, an epoxy resin.

The semiconductor device 1 may include a first face 11 connected, e.g. directly connected or bonded to the lead frame 2 and a second face 12 that faces the first face 11. A plurality of electrode pads may be provided on the second face 12. The lead frame 2, the semiconductor device 1, and a plurality of clips may be sealed by the molding 6. An outer surface 21 of a portion of the lead frame 2 that is connected, e.g. directly connected or bonded to the first face 11 of the semiconductor device 1 may be exposed to the outside of the molding 6, e.g. may not or may only partially be adjacent to the molding 6. As an example, the plurality of clips may include the gate clip 3, the drain clip 4, and the source clip 5. Exactly one or at least one of the plurality of clips may be connected to the lead frame 2.

The semiconductor device 1 may be or correspond to or consist of a discrete device such as a three-terminal transistor, and/or may include or consist of a horizontal channel-type semiconductor device. In the horizontal channel-type semiconductor device, a channel layer may be formed by extending in a horizontal direction, and a gate electrode, a drain electrode, and a source electrode may be arranged in an extending direction of the channel layer. Therefore, in the horizontal channel-type semiconductor device, a gate pad 13, a drain pad 14, and a source pad 15 respectively electrically connected to the gate electrode, the drain electrode, and the source electrode may be formed on one face of the semiconductor device 1, for example, the second face 12, as shown in FIG. 2. Alternatively or additionally the semiconductor device 1 may be, correspond to, consist of, or include a high electron mobility transistor (HEMT) having a horizontal channel structure. The semiconductor device 1 may be, correspond to, consist of, or include a GaN-based semiconductor power device. A power metal-oxide-semiconductor field-effect transistor (power MOSFET) and/or an insulated gate bipolar transistor (IGBT), and/or the like, which are based on silicon (Si) in single-crystal or polycrystalline phase, are used as semiconductor power devices, but due to limitations of silicon's material properties and/or manufacturing processes thereof, increasing the efficiency of silicon-based semiconductor power devices has become difficult. A gallium-nitride (GaN) semiconductor power device, in which a III-V series compound semiconductor is applied to a power device, may be easily applied as the high electron mobility transistor (HEMT), which utilizes a heterojunction structure of the compound semiconductor. Because a high current flows through the semiconductor power device, a packaging structure capable of implementing high heat dissipation performance and/or reducing parasitic inductance is required or desired.

The lead frame 2 may include a material having high thermal conductivity and/or electrical conductivity. As an example, the lead frame 2 may include or consist of copper (Cu). The first face 11 of the semiconductor device 1 may be connected, e.g. directly connected or bonded to the lead frame 2. The lead frame 2 and the first face 11 of the semiconductor device 1 may be connected, e.g. directly connected or bonded to each other by, for example, a thermally conductive adhesive or a thermally/electrically conductive adhesive. In order to improve heat dissipation performance, a size of the lead frame 2 may be greater than a size of the semiconductor device 1. Accordingly, the first face 11 of the semiconductor device 1 may be entirely bonded to the lead frame 2.

The gate clip 3, the drain clip 4, and the source clip 5 may be connected, e.g. directly connected or bonded to the gate pad 13, the drain pad 14, and the source pad 15, respectively. The gate clip 3, the drain clip 4, and the source clip 5 may include a material having high thermal conductivity and electrical conductivity. As an example, the gate clip 3, the drain clip 4, and the source clip 5 may include or consist of the same material as the lead frame 2. For example, the gate clip 3, the drain clip 4, and the source clip 5 may include copper (Cu), and/or may not include a material that is not present in the lead frame. The source clip 5 may be connected to the lead frame 2.

In some example embodiments, the source clip 5 may be formed integrally, e.g. homogenously, with the lead frame 2. The source clip 5 may include an extension portion 52 that extends from the lead frame 2 and is bent toward the second face 12 of the semiconductor device 1, and a bonding portion 51 that extends above the source pad 15 from the extension portion 52 and is connected, e.g. directly connected or bonded to the source pad 15. The extension portion 52 may be bent by about 180 degrees. The bonding portion 51 may be connected, e.g. directly connected or bonded to the source pad 15 by a method such as at least one of metal-to-metal bonding, solder bonding, etc. The bonding portion 51 may cover, e.g. entirely cover the source pad 15. The gate clip 3 may include a first bonding portion 31 connected, e.g. directly connected or bonded to the gate pad 13, and a first extension portion 32 extending parallel to the lead frame 2 from the first bonding portion 31. The first bonding portion 31 may be connected, e.g. directly connected or bonded to the gate pad 13 by a method such as metal-to-metal bonding, solder bonding, etc. The drain clip 4 may include a second bonding portion 41 connected, e.g. directly connected or bonded to the drain pad 14, and a second extension portion 42 extending parallel to the lead frame 2 from the second bonding portion 41. The second bonding portion 41 may be connected, e.g. directly connected or bonded to the drain pad 14 by a method such as at least one of metal-to-metal bonding, solder bonding, etc. According to the semiconductor device package of some example embodiments, without using a metal wire, the source clip 5, the drain clip 4, and the gate clip 3 may be electrically connected directly to the source pad 15, the drain pad 14, and the gate pad, respectively. Therefore, it may be possible to reduce the parasitic inductance of the semiconductor device package by reducing a length of an electrical connection path. Alternatively or additionally, because no metal wire is used, the packaging process cost and time may be reduced. Further, the source clip 5 may be formed integrally with the lead frame 2. Meanwhile, a plurality of source clips 5 may be formed on the lead frame 2. Accordingly, because the source clips 5 may be simultaneously connected to a plurality of semiconductor devices 1 on the lead frame 2, the process cost and time may be reduced.

At least one of the bonding portion 51 of the source clip 5, the first bonding portion 31 of the gate clip 3, and the second bonding portion 41 of the drain clip 4 may be buried in the molding 6. The lead frame 2 may be partially exposed to the outside of the molding 6. The outer surface 21 of the portion of the lead frame 2 that is connected, e.g. directly connected or bonded to the first face 11 of the semiconductor device 1 may be exposed to the outside of the molding 6. Faces 33 and 43 of the first extension portion 32 of the gate clip 3 and the second extension portion 42 of the drain clip 4, which face the first face 11 of the semiconductor device 1, may be exposed to the outside of the molding 6. The first extension portion 32 and the second extension portion 42 may be parallel to the lead frame 2.

Figure 3:
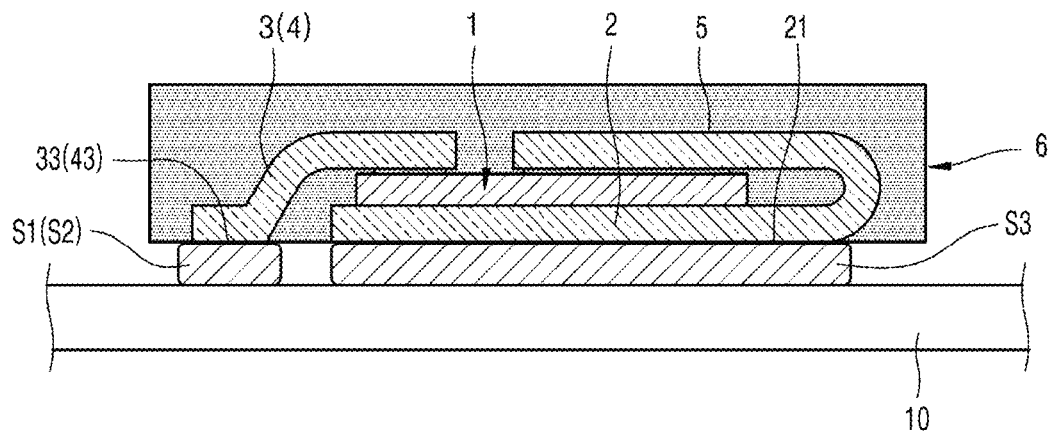
FIG. 3 shows a state in which the semiconductor device package of some example embodiments shown in FIG. 1 is mounted on a printed circuit board.

Accordingly, the semiconductor device package of some example embodiments may be mounted on a printed circuit board through a surface mounting process. FIG. 3 shows a state in which the semiconductor device package of example embodiments shown in FIG. 1 is mounted on a printed circuit board 10. Referring to FIG. 3, the outer surface 21 of the lead frame 2 may be connected, e.g. directly connected or bonded to the printed circuit board 10 by a solder S3. Because the source clip 5 may be integrally formed with the lead frame 2, the source pad 15 may be electrically connected to a circuit pattern on the printed circuit board 10 by the lead frame 2 and the source clip 5. The faces 33 and 43 of the first extension portion 32 of the gate clip 3 and the second extension portion 42 of the drain clip 4 may be electrically connected to the circuit pattern on the printed circuit board 10 by solders S1 and S2, respectively. Accordingly, the gate pad 13 and the drain pad 14 may be electrically connected to the circuit pattern on the printed circuit board 10 by the gate clip 3 and the drain clip 4, respectively.

A surface area of the outer surface 21 of the lead frame 2 may be greater than the surface area of the first face 11 of the semiconductor device 1. Accordingly, a wide, e.g. a very wide heat dissipation area may be secured, and thus, the heat dissipation performance of the semiconductor device package may be improved. In a case of the semiconductor power device, because a lot of current flows through the source electrode, heat dissipation through the source clip 5 may be very important. In order to facilitate current flow and heat dissipation, the source clip 5 may cover 30% or more of an area of the second face 12 of the semiconductor device 1. For example, the bonding portion 51 of the source clip 5 may cover 30% or more of the area of the second face 12 of the semiconductor device 1. Because the first face 11 of the semiconductor device 1 may be entirely bonded to the lead frame 2, 70% or more of areas of the first face 11 and the second face 12 of the semiconductor device 1 may be connected, e.g. directly connected or bonded to the lead frame 2 and the source clip 5, which are made of a conductive material. According to the semiconductor device package of some example embodiments, the source clip 5 may be integrally formed with the lead frame 2, so that heat generated from the source electrode may be easily dissipated through the source clip 5 and the lead frame 2. Accordingly, a semiconductor device package with improved heat dissipation performance may be implemented.

Figure 4:
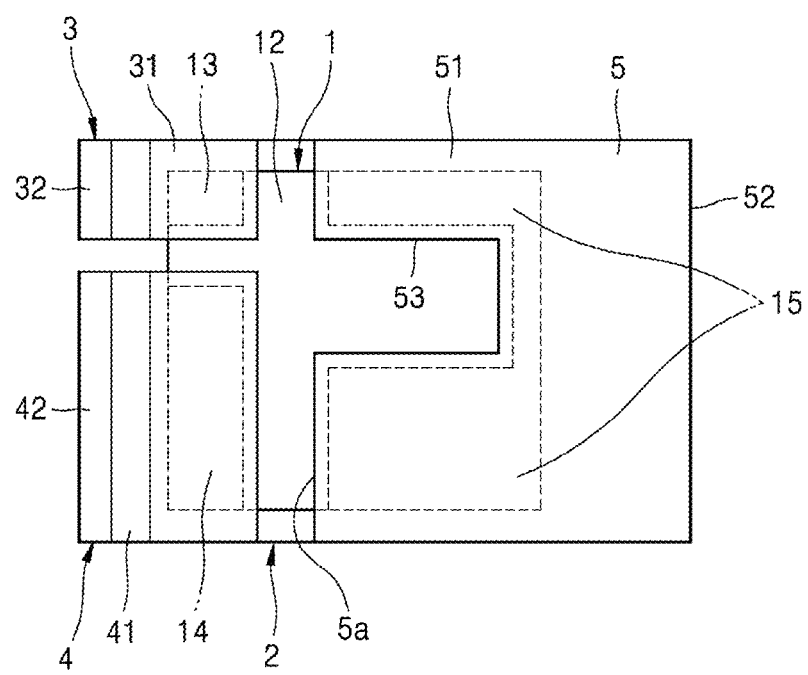
FIG. 4 is a schematic plan view of some example embodiments of a semiconductor device package.

FIG. 4 is a schematic plan view of some example embodiments of a semiconductor device package. Some example embodiments of the semiconductor device package shown in FIG. 4 has a difference in a shape of the source clip 5 compared to example embodiments of the semiconductor device package shown in FIGS. 1 to 3. Therefore, the difference will be mainly described, components having the same function are denoted by the same reference numerals, and duplicate descriptions thereof are omitted. Referring to FIG. 4, a recession portion 53 recessed toward the extension portion 52 may be provided at the bonding portion 51 of the source clip 5. In the semiconductor packaging process, a lead frame 2 integrally formed with the source clip 5 may be prepared, and then, the semiconductor device 1 may be inserted between the lead frame 2 and the bonding portion 51 of the source clip 5. In this case, the recession portion 53 may function as a passage through which a transfer mechanism for transferring the semiconductor device 1 may be moved. Accordingly, it may be possible to automate and increase the efficiency of the semiconductor device packaging process.

Figure 5:
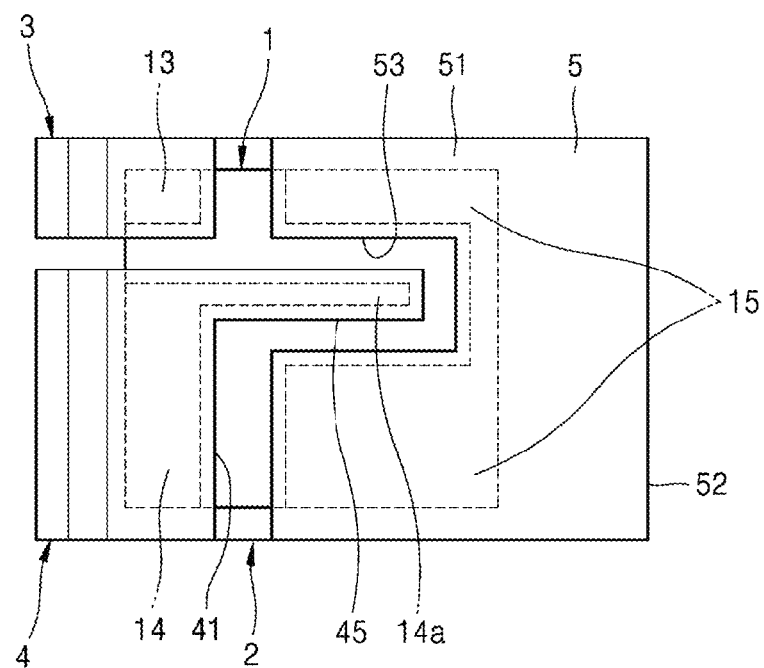
FIG. 5 is a schematic plan view of some example embodiments of a semiconductor device package.

FIG. 5 is a schematic plan view of some example embodiments of a semiconductor device package. Some example embodiments of the semiconductor device package shown in FIG. 5 has a difference in shapes of the drain pad 14 and the drain clip 4 compared to some example embodiments of the semiconductor device package shown in FIG. 4. Referring to FIG. 5, the recession portion 53 recessed toward the extension portion 52 may be provided at the bonding portion 51 of the source clip 5. The drain pad 14 may include an extension pad 14a extending into the recession portion 53. As a result, the drain pad 14 may have an overall "L" shape. The drain clip 4 may include an extension clip 45 extending above the extension pad 14a from the second bonding portion 41 and connected, e.g. directly connected or bonded to the extension pad 14a. With this configuration, a current path to the drain electrode may be expanded, and thus, a further effect of reducing the parasitic inductance may be obtained.

Figure 6:
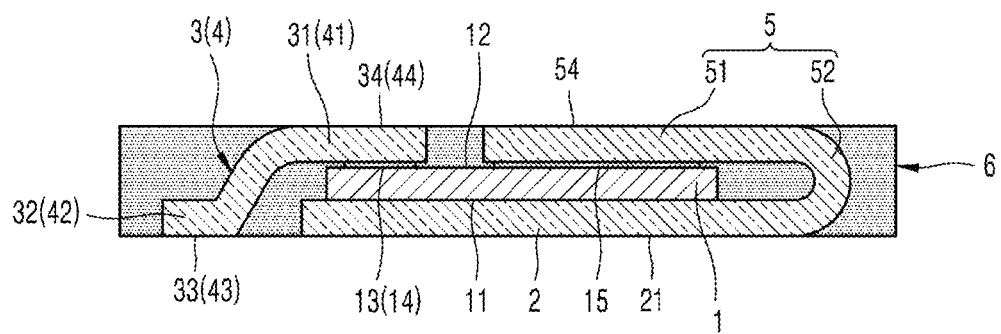
FIG. 6 is a schematic cross-sectional view of some example embodiments of a semiconductor device package.

FIG. 6 is a schematic cross-sectional view of some example embodiments of a semiconductor device package. Some example embodiments of the semiconductor device package shown in FIG. 6 has a difference in a shape of the molding 6 compared to example embodiments of the semiconductor device package shown in FIGS. 1 to 5. Referring to FIG. 6, the molding 6 may be formed to additionally expose faces 34, 44, and 54 of the bonding portion 51 of the source clip 5, the first bonding portion 31 of the gate clip 3, and the second bonding portion 41 of the drain clip 4, that respectively face the second face 12 of the semiconductor device 1, to the outside. According to such a configuration, a heat dissipation area may be expanded, and thus, the heat dissipation function may be improved. In addition, both faces of the semiconductor device package may be used as surfaces for surface mounting.

Figure 7:
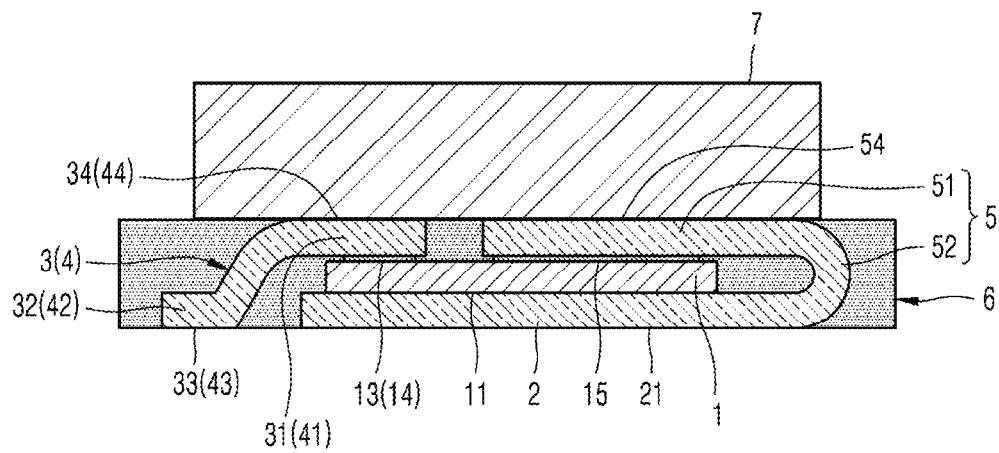
FIG. 7 is a schematic cross-sectional view of some example embodiments of a semiconductor device package.

FIG. 7 is a schematic cross-sectional view of some example embodiments of a semiconductor device package. Example embodiments of the semiconductor device package shown in FIG. 7 is different from example embodiments of the semiconductor device package shown in FIG. 6 in that the semiconductor device package further includes a heat dissipation body 7. Referring to FIG. 7, the molding 6 may be formed to additionally expose faces 34, 44, and 54 of the bonding portion 51 of the source clip 5, the first bonding portion 31 of the gate clip 3, and the second bonding portion 41 of the drain clip 4, that respectively face the second face 12 of the semiconductor device 1, to the outside. The heat dissipation body 7 may contact the faces 34, 44, and 54. The heat dissipation body 7 may be implemented in various forms, such as a heat dissipation fin and a heat slug. The heat dissipation body 7 may be adhered to the faces 34, 44, and 54 by a thermally conductive adhesive. With this configuration, the semiconductor device package may be implemented having improved heat dissipation performance.

The semiconductor device package of example embodiments shown in FIG. 7 may be mounted on the printed circuit board 10 as shown in FIG. 3. That is, the source pad 15 may be electrically connected to the circuit pattern on the printed circuit board 10 by bonding the outer surface 21 of the lead frame 2 to the printed circuit board 10 using solder S3, and the gate pad 13 and the drain pad 14 may be electrically connected to the circuit pattern on the printed circuit board 10 by bonding the faces 33 and 43 of the first extension portion 32 of the gate clip 3 and the second extension portion 42 of the drain clip 4, respectively, to the printed circuit board 10 using solders S1 and S2. The heat dissipation body 7 may be on an opposite side of the printed circuit board 10.

Figure 8:
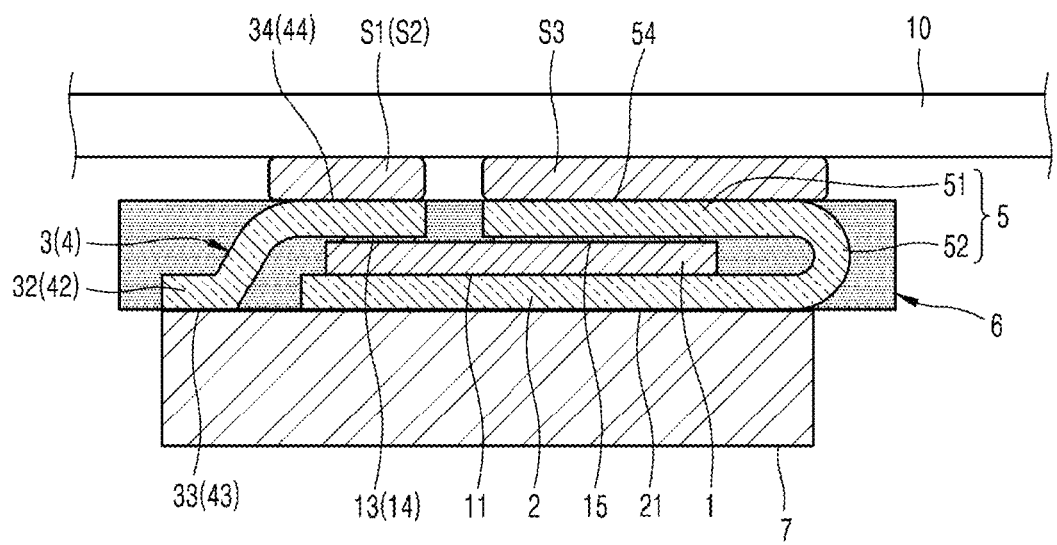
FIG. 8 shows another example of a state in which the semiconductor device package shown in FIG. 6 is mounted on a printed circuit board.

FIG. 8 shows another example of a state in which the semiconductor device package shown in FIG. 6 is mounted on the printed circuit board 10. Referring to FIG. 8, the source pad 15 may be electrically connected to the circuit pattern on the printed circuit board 10 by the face 51 of the bonding portion 51 of the source clip 5 to the printed circuit board 10 using solder S3, and the gate pad 13 and the drain pad 14 may be electrically connected to the circuit pattern on the printed circuit board 10 by bonding the faces 34 and 44 of the first extension portion 31 of the gate clip 3 and the second extension portion 41 of the drain clip 4, respectively, to the printed circuit board 10 using solders S1 and S2. The heat dissipation body 7 may be on the opposite side of the printed circuit board 10, and may contact the outer surface 21 of the lead frame 2 and the faces 33 and 43 of the first extension portion 32 of the gate clip 3 and the second extension portion 42 of the drain clip 4.

Figure 9:
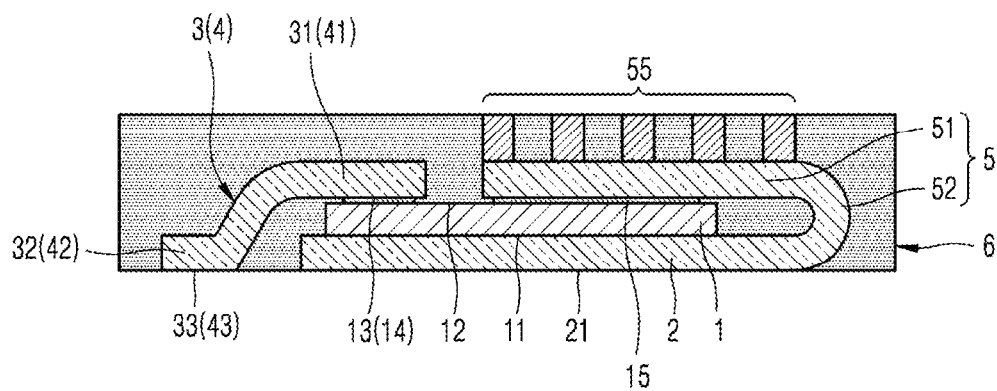
FIG. 9 is a schematic cross-sectional view of some example embodiments of a semiconductor device package.

FIG. 9 is a schematic cross-sectional view of some example embodiments of a semiconductor device package. The semiconductor device package of example embodiments may have a difference from the semiconductor device package of example embodiments shown in FIG. 1 in that a heat dissipation structure is provided in the source clip 5. Referring to FIG. 9, the outer surface 21 of the lead frame 2 and the faces 33 and 43 of the first extension portion 32 of the gate clip 3 and the second extension portion 42 of the drain clip 4 may be exposed to the outside of the molding 6. The bonding portion 51 of the source clip 5, the first bonding portion 31 of the gate clip 3, and the second bonding portion 41 of the drain clip 4 may be buried in the molding 6. Heat dissipation fins 55 may be provided at the bonding portion 51. The heat dissipation fins 55 may be exposed to the outside of the molding 6. The number of heat dissipation fins 55 is not particularly limited. The heat dissipation fins 55 may be combined to, for example, connected/directly connected/bonded to the bonding portion 51, and may be integrally formed with the bonding portion 51. Accordingly, the semiconductor device package may be implemented having improved heat dissipation performance.

Figure 10:
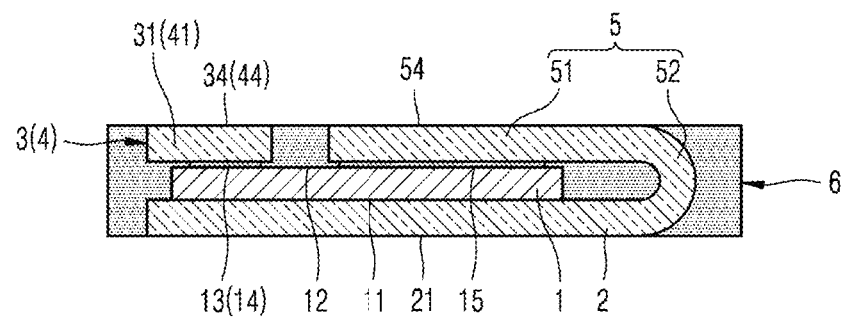
FIG. 10 is a schematic cross-sectional view of some example embodiments of a semiconductor device package.

FIG. 10 is a schematic cross-sectional view of some example embodiments of a semiconductor device package. The semiconductor device package of example embodiments may have a difference in the shapes of the gate clip 3 and the drain clip 4 compared to the semiconductor device package of example embodiments shown in FIG. 6. Referring to FIG. 10, the gate clip 3 and the drain clip 4 may include a first bonding portion 31 and a second bonding portion 41 connected/directly connected/bonded to the gate pad 13 and the drain pad 14, respectively. For example, in the gate clip 3 and the drain clip 4 of example embodiments, the first extension portion 32 and the second extension portion 42 respectively formed in the gate clip 3 and the drain clip 4 shown in FIG. 6 may be omitted. The faces 54, 34, and 44 of the bonding portion 51, the first bonding portion 31, and the second bonding portion 41 may be exposed to the outside of the molding 6. The semiconductor device package of example embodiments may be mounted on the printed circuit board 10 in the form shown in FIG. 8. The outer surface 21 of the lead frame 2 may be exposed to the outside of the molding 6. The heat dissipation body 7 as shown in FIG. 8 may contact the outer surface 21 of the lead frame 2.

Figure 11:
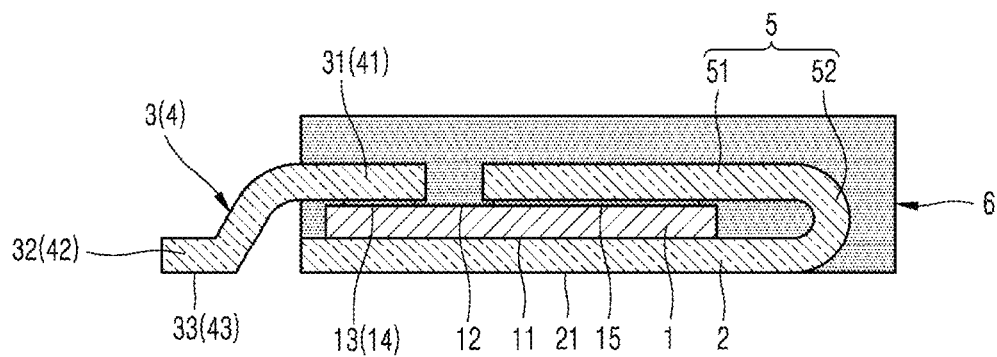
FIG. 11 is a schematic cross-sectional view of some example embodiments of a semiconductor device package.

FIG. 11 is a schematic cross-sectional view of some example embodiments of a semiconductor device package. The semiconductor device package of this embodiment may have a difference in a range in which the molding 6 is formed compared to the semiconductor device package of example embodiments shown in FIG. 1. Referring to FIG. 11, the gate clip 3 may include the first bonding portion 31 connected, e.g. directly connected or bonded to the gate pad 13 and the first extension portion 32 extending parallel to the lead frame 2 from the first bonding portion 31. The drain clip 4 may include the second bonding portion 41 connected, e.g. directly connected or bonded to the drain pad 14, and the second extension portion 42 extending parallel to the lead frame 2 from the second bonding portion 41. The first extension portion 32 and the second extension portion 42 may be entirely exposed to the outside of the molding 6.

Figure 12:
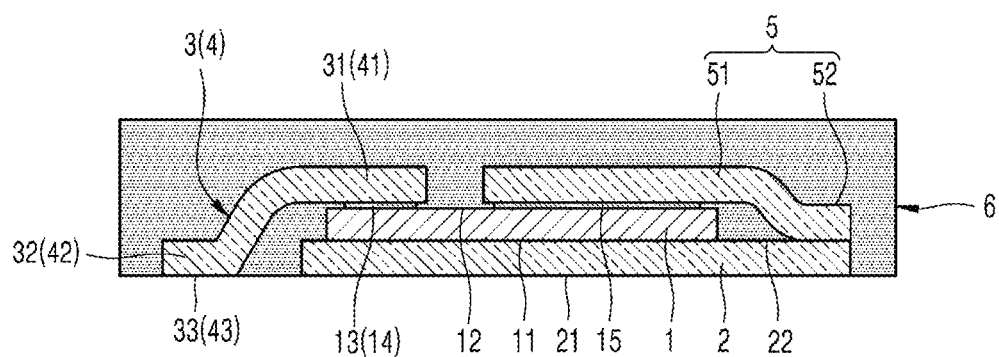
FIG. 12 is a schematic cross-sectional view of some example embodiments of a semiconductor device package.

FIG. 12 is a schematic cross-sectional view of some example embodiments of a semiconductor device package. The semiconductor device package of example embodiments may have a difference from the semiconductor device package of example embodiments shown in FIG. 1 in that the source clip 5 is provided separately from the lead frame 2 and then connected, e.g. directly connected or bonded to the lead frame 2. Referring to FIG. 12, the source clip 5 may include the bonding portion 51 connected, e.g. directly connected or bonded to the source pad 15, and the extension portion 52 that extends to an upper surface 22 of the lead frame 2 from the bonding portion 51 and is then connected, e.g. directly connected or bonded to the upper surface 22 of the lead frame 2. The upper surface 22 of the lead frame 2 may be to which the first surface 11 of the semiconductor device 1 is connected, e.g. directly connected or bonded, and may be opposite to the outer surface 21 of the lead frame 2. The outer surface 21 of the lead frame 2 may be exposed to the outside of the molding 6. Faces 33 and 43 of the first extension portion 32 of the gate clip 3 and the second extension portion 42 of the drain clip 4, which respectively face the first face 11 of the semiconductor device 1, may be exposed to the outside of the molding 6.

Figure 13:
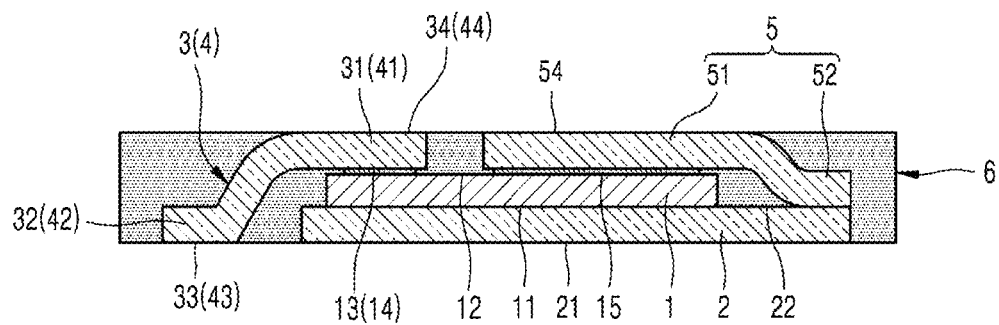
FIGS. 13 to 15 show modified examples of the embodiment of the semiconductor device package shown in FIG. 12.
Figure 14:
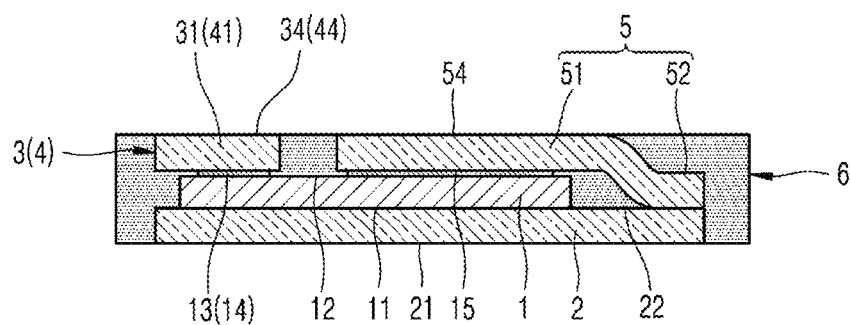
Figure 15:
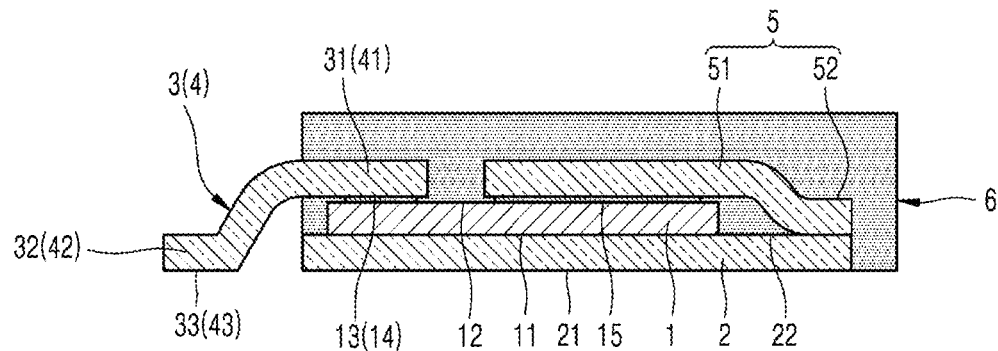

Some example embodiments of the semiconductor device package shown in FIG. 12 may be applied to example embodiments shown in FIGS. 2 to 11. FIGS. 13 to 15 show modified examples of the example embodiments of the semiconductor device package shown in FIG. 12. Referring to FIG. 13, the molding 6 may be formed to additionally expose faces 34, 44, and 54 of the bonding portion 51 of the source clip 5, the first bonding portion 31 of the gate clip 3, and the second bonding portion 41 of the drain clip 4, that respectively face the second face 12 of the semiconductor device 1, to the outside. Referring to FIG. 14, in the gate clip 3 and the drain clip 4, the first extension portion 32 and the second extension portion 42 may be omitted compared to the gate clip 3 and the drain clip 4 shown in FIG. 13. The faces 54, 34, and 44 of the bonding portion 51, the first bonding portion 31, and the second bonding portion 41 may be exposed to the outside of the molding 6. Referring to FIG. 15, the gate clip 3 may include the first bonding portion 31 connected, e.g. directly connected or bonded to the gate pad 13 and the first extension portion 32 extending parallel to the lead frame 2 from the first bonding portion 31. The drain clip 4 may include the second bonding portion 41 connected, e.g. directly connected or bonded to the drain pad 14, and the second extension portion 42 extending parallel to the lead frame 2 from the second bonding portion 41. The first extension portion 32 and the second extension portion 42 may be entirely exposed to the outside of the molding 6.

Figure 16A:
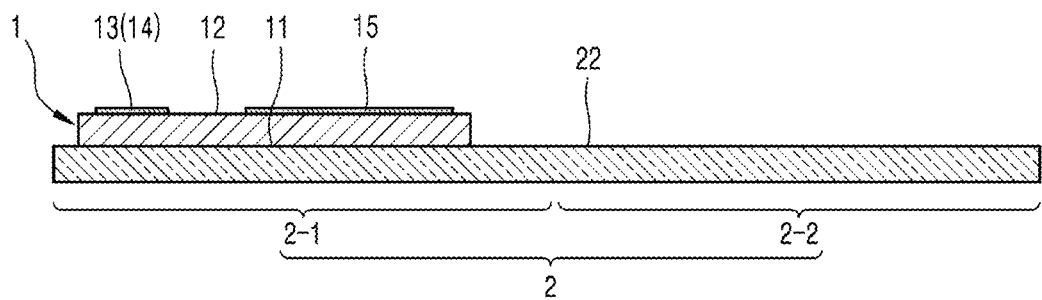
FIGS. 16A to 16C show some example embodiments of a method of manufacturing a semiconductor device package.
Figure 16B:
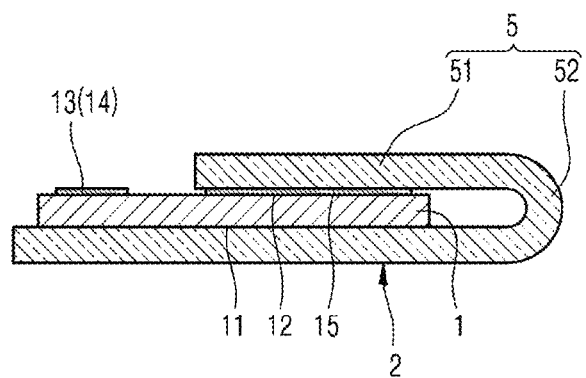
Figure 16C:
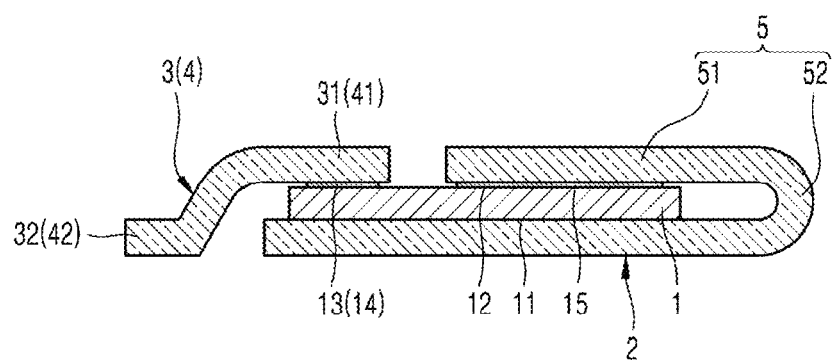

FIGS. 16A to 16C show some example embodiments of a method of manufacturing a semiconductor device package. Referring to FIG. 16A, the lead frame 2 of plate-type may be prepared. A width of the lead frame 2 may be greater than a width of the semiconductor device 1. A length of the lead frame 2 may be greater than the sum of a length of the semiconductor device 1 and a length of the source clip 5 to be described later. For example, the lead frame 2 may include a first portion 2-1 and a second portion 2-2 extending from the first portion 2-1. The first portion 2-1 may be a part to which the semiconductor device 1 is connected, e.g. directly connected or bonded, and the second portion 2-2 may be a portion where the source clip 5 is to be formed. The semiconductor device 1 may have the first face 11 and the second face 12. The gate pad 13, the drain pad 14, and the source pad 15 may be provided on the second face 12 of the semiconductor device 1. The first face 11 of the semiconductor device 1 may be connected, e.g. directly connected or bonded to the upper surface 22 of the first portion 2-1 using, for example, thermally conductive adhesive and/or thermally/electrically conductive adhesive. Then, as shown in FIG. 16B, the second portion 2-2 may be bent 180 degrees, for example, and may be connected, e.g. directly connected or bonded to the source pad 15. Bonding may be performed in a variety of ways, such as at least one of metal-metal bonding and solder bonding. Thus, the source clip 5 having the bonding portion 51 connected, e.g. directly connected or bonded to the source pad 15 and the extension portion 52 that is bent from the bonding portion 51 and connected to the lead frame 2 may be integrally formed. Next, as shown in FIG. 16C, the gate clip 3 having the first bonding portion 31 and the first extension portion 32 that are connected to each other in a Z-shape may be prepared, and then the first bonding portion 31 may be connected, e.g. directly connected or bonded to the gate pad 13. The first extension portion 32 may extend parallel to the lead frame 2 from the first bonding portion 31. Further, the drain clip 4 having the second bonding portion 41 and the second extension portion 42 that are connected to each other in the Z-shape may be prepared, and then the second bonding portion 41 may be connected, e.g. directly connected or bonded to the drain pad 14. The second extension portion 42 may extend parallel to the lead frame 2 from the second bonding portion 41. The semiconductor device package shown in FIGS. 1, 6, and 11 may be manufactured by sealing the result performed up to FIG. 16C, using electrically insulating resin, for example, epoxy resin. When the gate clip 3 and the drain clip 4 each having the first bonding portion 31 and the second bonding portion 41 are applied, the semiconductor device package shown in FIG. 10 may be manufactured.

Figure 17A:
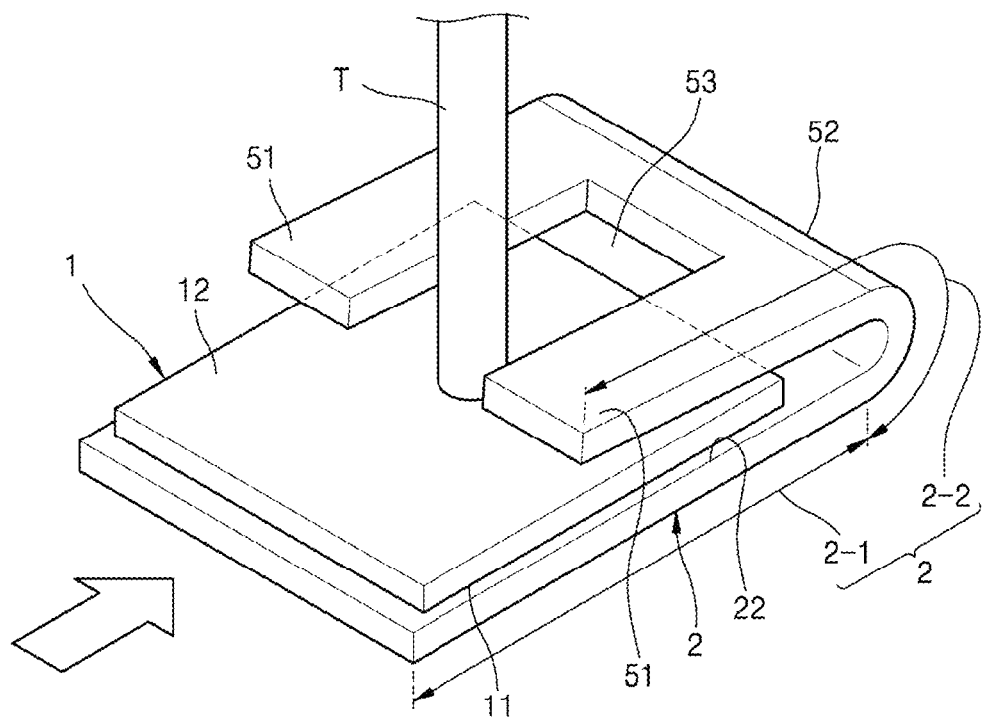
FIGS. 17A to 17E show some example embodiments of a method of manufacturing a semiconductor device package.
Figure 17B:
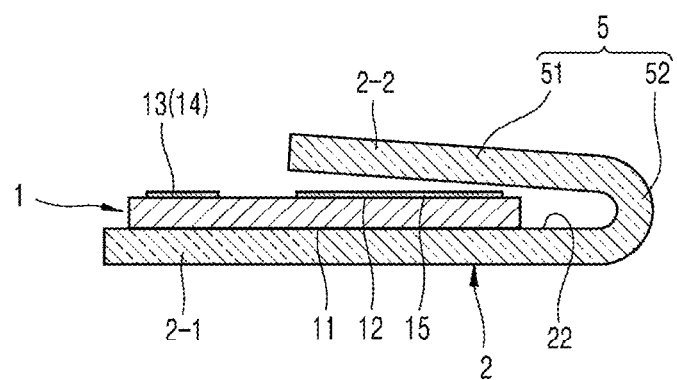
Figure 17C:
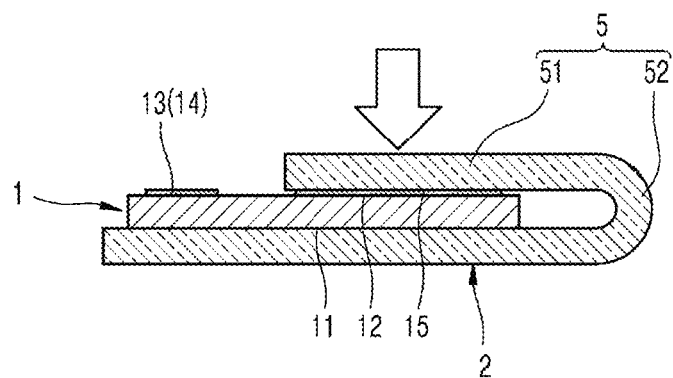
Figure 17D:
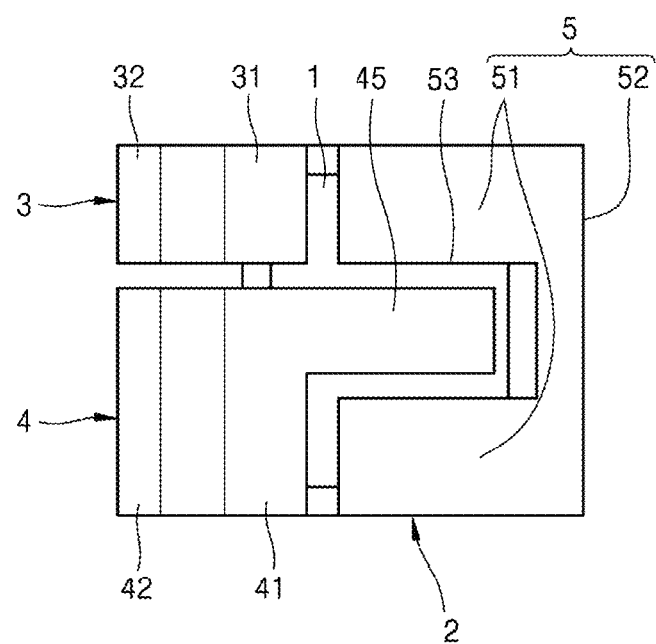
Figure 17E:
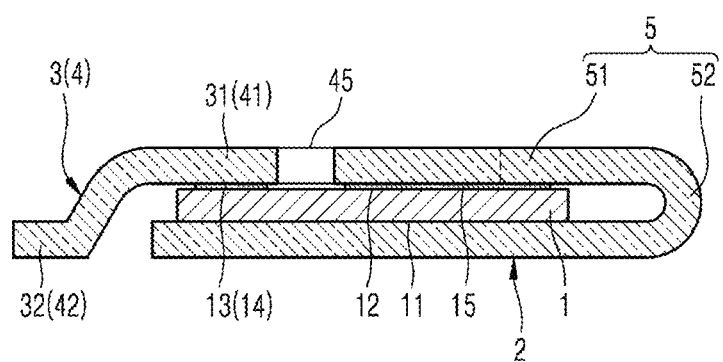

FIGS. 17A to 17E show some example embodiments of a method of manufacturing a semiconductor device package. First, referring to FIG. 17A, the lead frame 2 including the first portion 2-1 and the second portion 2-2 bent from the first portion 2-1 may be prepared. The second portion 2-2 may include the extension portion 52 bent from the first portion 2-1, and the bonding portion 51 extending parallel to the first portion 2-1 from the extension portion 52. The recession portion 53 recessed toward the extension portion 52 may be provided at the bonding portion 51. The semiconductor device 1 may be inserted between the first portion 2-1 and the second portion 2-2 using, for example, a transfer mechanism T. At this time, the recession portion 53 may provide a space through which the transfer mechanism T may enter. Accordingly, the semiconductor device 1 may be easily positioned between the first portion 2-1 and the second portion 2-2, thereby improving process efficiency. Next, as shown in FIG. 17B, the first face 11 of the semiconductor device 1 may be connected, e.g. directly connected or bonded to the upper surface 22 of the first portion 2-1. Then, as shown in FIG. 17C, the bonding portion 51 may be connected, e.g. directly connected or bonded to the source pad 15 provided on the second face 12 of the semiconductor device 1. Accordingly, the source clip 5 including the bonding portion 51 and the extension portion 52 may be integrally formed with the lead frame 2. Next, as shown in FIGS. 17D and 17E, the gate clip 3 having the first bonding portion 31 and the first extension portion 32 that are connected to each other in the Z-shape may be prepared, and then the first bonding portion 31 may be connected, e.g. directly connected or bonded to the gate pad 13. The first extension portion 32 may extend parallel to the lead frame 2 from the first bonding portion 31. In addition, the drain clip 4 having the second bonding portion 41 and the second extension portion 42 that are connected to each other in the Z-shape, and the extension clip 45 extending from the second bonding portion 41 may be prepared, and then the second bonding portion 41 may be connected, e.g. directly connected or bonded to the drain pad 14. The second extension portion 42 may extend parallel to the lead frame 2 from the second bonding portion 41. The semiconductor device package shown in FIGS. 1, 6, and 11 may be manufactured by sealing the result performed up to FIG. 17E, using electrically insulating resin, for example, epoxy resin. When the gate clip 3 and the drain clip 4 each having the first bonding portion 31 and the second bonding portion 41 are applied, the semiconductor device package shown in FIG. 10 may be manufactured.

Figure 18:
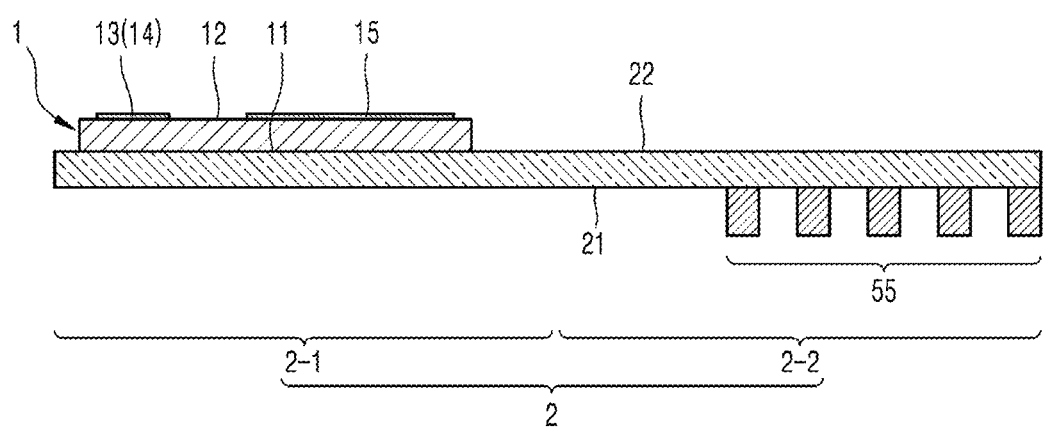
FIG. 18 shows some example embodiments of a method of manufacturing a semiconductor device package.

FIG. 18 shows some example embodiments of a method of manufacturing a semiconductor device package. Referring to FIG. 18, the lead frame 2 may include the first portion 2-1 and the second portion 2-2 extending from the first portion 2-1. The first portion 2-1 may be the part to which the semiconductor device 1 is connected, e.g. directly connected or bonded, and the second portion 2-2 may be the part where the source clip 5 is to be formed. Heat dissipation fins 55 may be provided on the outer surface 21 of the second portion 2-2. The heat dissipation fins 55 may be coupled to the outer surface 21 of the second portion 2-2, and/or the heat dissipation fins 55 may be integrally formed with or may be integral with the second portion 2-2. The lead frame 2 described above may be prepared, and then the semiconductor device 1 may be connected, e.g. directly connected or bonded to the upper surface 22 of the first portion 2-1. Then, by performing the subsequent processes described with respect to FIGS. 16B and 16C, the semiconductor device package illustrated in FIG. 9 may be manufactured.

Figure 19A:
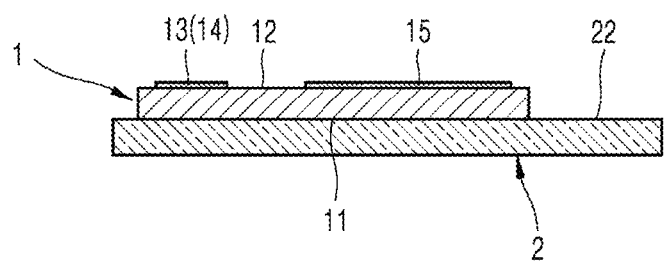
FIGS. 19A to 19C show some example embodiments of a method of manufacturing a semiconductor device package.
Figure 19B:
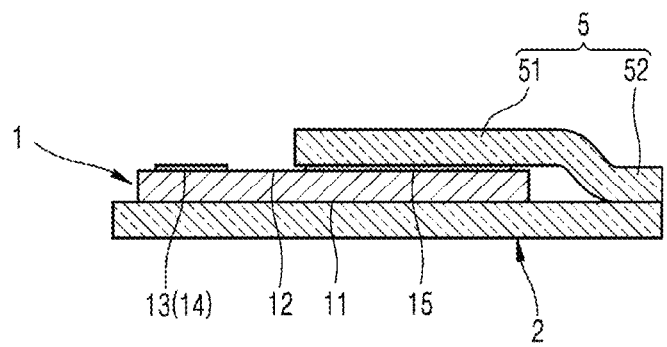
Figure 19C:
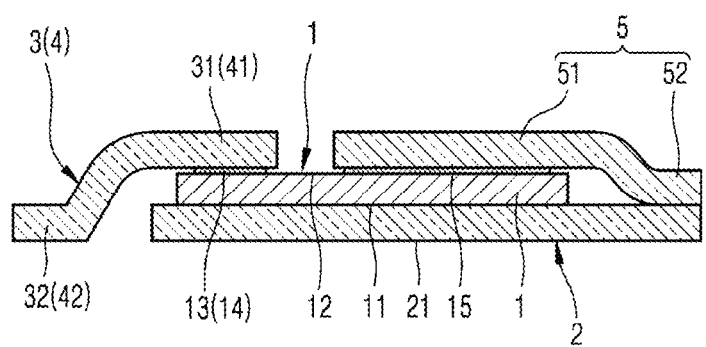

FIGS. 19A to 19C show some example embodiments of a method of manufacturing a semiconductor device package. Referring to FIG. 19A, the lead frame 2 of plate-type may be prepared. The width of the lead frame 2 may be greater than the width of the semiconductor device 1. The length of the lead frame 2 may be greater than the length of the semiconductor device 1. The semiconductor device 1 may have the first face 11 and the second face 12. The gate pad 13, the drain pad 14, and the source pad 15 may be provided on the second face 12 of the semiconductor device 1. The first face 11 of the semiconductor device 1 may be connected, e.g. directly connected or bonded to the upper surface 22 of the lead frame 2 using, for example, thermally conductive adhesive, thermally/electrically conductive adhesive, and the like. Then, as shown in FIG. 19B, the source clip 5 having the bonding portion 51 and the extension portion 52 that are connected to each other in the Z-shape may be prepared, and then the bonding portion 51 may be connected, e.g. directly connected or bonded to the source pad 15. The extension portion 52 may be connected, e.g. directly connected or bonded to the upper surface 22 of the lead frame 2 by, for example, welding, riveting, metal-metal bonding, or the like. Next, as shown in FIG. 19C, the gate clip 3 having the first bonding portion 31 and the first extension portion 32 that are connected to each other in the Z-shape may be prepared, and then the first bonding portion 31 may be connected, e.g. directly connected or bonded to the gate pad 13. The first extension portion 32 may extend parallel to the lead frame 2 from the first bonding portion 31. Further, the drain clip 4 having the second bonding portion 41 and the second extension portion 42 that are connected to each other in the Z-shape may be prepared, and then the second bonding portion 41 may be connected, e.g. directly connected or bonded to the drain pad 14. The second extension portion 42 may extend parallel to the lead frame 2 from the second bonding portion 41. The semiconductor device package shown in FIGS. 12, 13, and 15 may be manufactured by sealing the result performed up to FIG. 19C, using electrically insulating resin, for example, epoxy resin. When the gate clip 3 and the drain clip 4 each having the first bonding portion 31 and the second bonding portion 41 are applied, the semiconductor device package shown in FIG. 14 may be manufactured.

According to some example embodiments of the semiconductor device package, because the electrode pad of the semiconductor device and the clip may be connected, e.g. directly connected, without using the metal wire, parasitic inductance may be reduced. Alternatively or additionally, because without individually performing a process of connecting the source clip to each semiconductor device, the connecting process may be simultaneously performed for all the semiconductor devices in the lead frame, the process cost and/or time may be reduced.

Alternatively or additionally, heat dissipation performance may be improved by connecting the lead frame that is in contact with the semiconductor device in the largest area, to the source clip through which the most current flows.

It should be understood that some example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A semiconductor device package comprising:
   a lead frame;
   a semiconductor device including a first face connected to the lead frame, a second face that faces the first face, a gate pad, a drain pad, and a source pad, the gate pad exposed on the second face of the semiconductor device, the drain pad exposed on the second face of the semiconductor device, and the source pad exposed on the second face of the semiconductor device;
   a gate clip connected to the gate pad;
   a drain clip connected to the drain pad;
   a source clip connected to the source pad, the source clip connected to the lead frame; and
   a molding configured to seal the lead frame, the semiconductor device, the source clip, the drain clip, and the gate clip,
   wherein the source clip is integral with the lead frame, and
   wherein the source clip and the lead frame is a single continuous piece that extends continuously from the first face of the semiconductor device to the second face of the semiconductor device.

2. The semiconductor device package of claim 1, wherein the source clip includes a bonding portion connected to the source pad, and
   the bonding portion covers 30% or more of an area of the second face of the semiconductor device.

3. The semiconductor device package of claim 1, wherein the source clip comprises:
   an extension portion bent from the lead frame, the extension portion bent toward the second face; and
   a bonding portion extending above the source pad, the bonding portion extending from the extension portion, the bonding portion connected to the source pad.

4. The semiconductor device package of claim 3, wherein the bonding portion has a recession portion recessed toward the extension portion.

5. The semiconductor device package of claim 4, wherein the drain pad comprises an extension pad, and
   the drain clip comprises an extension clip extending into the recession portion and, the extension clip connected to the extension pad.

6. The semiconductor device package of claim 3, wherein the gate clip comprises a first bonding portion connected to the gate pad and a first extension portion extending parallel to the lead frame, the first extension portion extending from the first bonding portion, the drain clip comprises a second bonding portion connected to the drain pad and a second extension portion extending parallel to the lead frame, the second extension portion extending from the second bonding portion, an outer surface of a portion of the lead frame that is opposite from a surface of the lead frame connected to the first face is exposed to an outside of the molding, a first extension portion face of the first extension portion that faces in a same direction as the outer surface of the portion of the lead frame is exposed to the outside of the molding, and a second extension portion face of the second extension portion that faces in the same direction as the outer surface of the portion of the lead frame is exposed to the outside of the molding.

7. The semiconductor device package of claim 6, wherein the first extension portion and the second extension portion are entirely exposed to the outside of the molding.

8. The semiconductor device package of claim 6, wherein a bonding portion face of the bonding portion that faces away from the second face of the semiconductor device is exposed to the outside of the molding, a first bonding portion face of the first bonding portion that faces away from the second face of the semiconductor device is exposed to the outside of the molding, and a second bonding portion face of the second bonding portion that faces away from the second face of the semiconductor device is exposed to the outside of the molding.

9. The semiconductor device package of claim 8, further comprising:

a heat dissipation body contacting the bonding portion face of the bonding portion that faces away from the second face of the semiconductor device, contacting the first bonding portion face of the first bonding portion that faces away from the second face of the semiconductor device, and contacting the second bonding portion face of the second bonding portion that faces away from the second face of the semiconductor device.

10. The semiconductor device package of claim 6, wherein the bonding portion is buried in the molding, and the bonding portion has a heat dissipation fin exposed to the outside of the molding.

11. The semiconductor device package of claim 3, wherein the gate clip comprises a first bonding portion connected to the gate pad, the drain clip comprises a second bonding portion that is connected to the drain pad, an outer surface of a portion of the lead frame that is opposite from a surface of the lead frame connected to the first face is exposed to an outside of the molding, a bonding portion face of the bonding portion that faces away from the second face of the semiconductor device is exposed to the outside of the molding, a first bonding portion face of the first bonding portion that faces away from the second face of the semiconductor device is exposed to the outside of the molding, and a second bonding portion face of the second bonding portion that faces away from the second face of the semiconductor device is exposed to the outside of the molding.

12. A semiconductor device package comprising:

a lead frame;

a three terminal semiconductor device comprising a first face connected to the lead frame, a second face that faces the first face, and a plurality of electrode pads exposed on the second face, the plurality of electrode pads including three electrode pads;

a plurality of clips connected to the plurality of electrode pads, the plurality of clips including three clips; and a molding configured to seal the lead frame, the three terminal semiconductor device, and the plurality of clips, wherein an outer surface of a portion of the lead frame that is opposite from a surface of the lead frame connected to the first face of the three terminal semiconductor device is exposed to an outside of the molding, one of the plurality of clips is integral with the lead frame, and wherein the one of the plurality of clips and the lead frame is a single continuous piece that extends continuously from the first face of the three terminal semiconductor device to the second face of the three terminal semiconductor device.

13. The semiconductor device package of claim 12, wherein the three terminal semiconductor device includes a horizontal channel-type semiconductor power device.

* * * * *